United States Patent
Luo

(10) Patent No.: US 8,952,740 B2
(45) Date of Patent: Feb. 10, 2015

(54) PULSED LATCHING APPARATUS AND METHOD FOR GENERATING PULSE SIGNAL OF PULSED LATCH THEREOF

(71) Applicant: Industrial Technology Research Institute, Hsinchu (TW)

(72) Inventor: Shien-Chun Luo, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/019,554

(22) Filed: Sep. 6, 2013

(65) Prior Publication Data

US 2014/0218092 A1 Aug. 7, 2014

Related U.S. Application Data

(60) Provisional application No. 61/759,405, filed on Feb. 1, 2013.

(30) Foreign Application Priority Data

Jul. 16, 2013 (TW) .............................. 102125449 A

(51) Int. Cl.
  *H03K 3/00* (2006.01)
  *H03K 3/012* (2006.01)
  (Continued)

(52) U.S. Cl.
  CPC .......... *H03K 3/012* (2013.01); *H03K 3/356156* (2013.01); *H03K 5/05* (2013.01)
  USPC ........... 327/291; 327/199; 327/210; 327/212; 327/299

(58) Field of Classification Search
  USPC ......... 327/171–172, 176, 199–200, 207–212, 327/223, 225, 291, 293–294, 298–299
  See application file for complete search history.

(56) References Cited

U.S. PATENT DOCUMENTS 5,557,225 A * 9/1996 Denham et al. ................ 327/199
5,949,266 A    9/1999 Hinds et al.
(Continued)

FOREIGN PATENT DOCUMENTS

CN 101867358 10/2010
TW 200518461 6/2005
TW 201238254 9/2012

OTHER PUBLICATIONS

Wang Qing-Xia, et al., "Dual-Vth based double-edge explicit-pulsed level-converting flip-flops", IEEE, International Conference on Electronics, Communications and Control (ICECC), Sep. 9-11, 2011, pp. 837-840.

(Continued)

*Primary Examiner* — An Luu
(74) *Attorney, Agent, or Firm* — Jianq Chyun IP Office

(57) ABSTRACT

A pulsed latching apparatus and a method for generating a pulse signal are provided. The pulsed latching apparatus consists of a pulsed latch and a pulse signal generator. A data input terminal of the pulsed latch receives input data, the pulsed latch latches the input data according to a pulse signal, and transmits the latched input data through the data output terminal to serve as output data. The pulse signal generator duplicates a data transmission delay between the data input terminal and the data output terminal of the pulsed latch to obtain a duplicated delay. The pulse signal generator receives a clock signal, and processes the clock signal according to the duplicated delay to generate the pulse signal.

18 Claims, 8 Drawing Sheets

(51) Int. Cl.
*H03K 3/356* (2006.01)
*H03K 5/05* (2006.01)

(56) References Cited

U.S. PATENT DOCUMENTS

| | | | |
|---|---|---|---|
| 6,822,885 B2 | 11/2004 | Bunce et al. | |
| 6,828,837 B2 | 12/2004 | Ahn | |
| 7,202,724 B2* | 4/2007 | Kim | 327/218 |
| 7,583,103 B2 | 9/2009 | Lewis et al. | |
| 7,782,108 B2* | 8/2010 | Sedlak | 327/211 |
| 8,120,406 B2 | 2/2012 | Iyer et al. | |
| 8,232,824 B2 | 7/2012 | Wang et al. | |
| 8,656,238 B2* | 2/2014 | Lee et al. | 714/731 |
| 2011/0089977 A1 | 4/2011 | Hunter et al. | |
| 2013/0031434 A1* | 1/2013 | Patent et al. | 714/726 |

OTHER PUBLICATIONS

Yi-Lin Chuang, et al., "Pulsed-latch aware placement for timing-integrity optimization", Design Automation Conference (DAC), Jun. 2010, pp. 280-285.

Kalarikkal Absel, et al., "Low-Power Dual Dynamic Node Pulsed Hybrid Flip-Flop Featuring Efficient Embedded Logic" IEEE, Transactions on Very Large Scale Integration (VLSI) Systems, Vol. 21, No. 9, Sep. 2013, pp. 1693-1704.

Myint Wai Phyu, et al., "Power-Efficient Explicit-Pulsed Dual-Edge Triggered Sense-Amplifier Flip-Flop", IEEE, Transactions on Very Large Scale Integration (VLSI) Systems, vol. 19, No. 1, Jan. 2011, pp. 1-9.

Jin-Fa Lin, et al., "A low Power dual-mode pulse triggered flip-flop using pass transistor logic", IEEE, International Symposium on Next-Generation Electronics (ISNE), Nov. 2010, pp. 203-206.

Yin-Tsung Hwang, et al., "Low-Power Pulsed-Triggered Flip-Flop Design With Conditional Pulse-Enhancement Scheme", IEEE, Transactions on Very Large Scale Integration (VLSI) Systems, vol. 20, No. 2, Feb. 2012, pp. 361-366.

Tay-Jyi Lin, et al., "A 0.48V 0.57nJ/Pixel Video Recording SoC in 65nm CMOS", IEEE, International Solid-State Circuits Conference (ISSCC), Feb. 17-21, 2013, pp. 158-160.

Yi-Lin Chuang, et al., "Pulsed-latch aware placement for timing-integrity optimization" IEEE, Transactions on Computer-Aided Design of Integrated Circuits and systems, vol. 30, No. 12, Dec. 2011, pp. 1856-1869.

* cited by examiner

PULSED LATCHING APPARATUS AND METHOD FOR GENERATING PULSE SIGNAL OF PULSED LATCH THEREOF

CROSS-REFERENCE TO RELATED APPLICATION

This application claims the priority benefits of U.S. provisional application Ser. No. 61/759,405, filed on Feb. 1, 2013 and Taiwan application serial no. 102125449, filed on Jul. 16, 2013. The entirety of each of the above-mentioned patent applications is hereby incorporated by reference herein and made a part of this specification.

TECHNICAL FIELD

The disclosure relates to a pulsed latching apparatus. Particularly, the disclosure relates to a method for generating a pulse signal of a pulsed latch.

BACKGROUND

A pulsed latching apparatus can also be referred to as a pulsed flip-flop, which is a high-speed clock-controlled storage device. In the past, the pulse width of the pulsed latching apparatus is not strictly defined, which results in lack of design standards of a pulse signal generator of the pulsed latching apparatus. However, in an actual application, the pulse width of the pulse signal provided by the pulse signal generator is rather sensitive to the operating voltage of the pulsed latching apparatus, so that the pulsed latching apparatus generally cannot be used in a system in which the operating voltage is wide-range and dynamically scaled.

Generally, if the pulse width of the pulse signal generated by the pulse signal generator is designed to be too wide, the hold time of the pulsed latching apparatus is increased to increase a chance of hold time violation. Conversely, if the pulse width of the pulse signal generated by the pulse signal generator is designed to be too narrow, the latching time delay of the pulsed latching apparatus is increased, which increases the chance of setup time violation and the error rate. It is simple to design a pulse signal with a suitable pulse width in allusion to a single operating voltage, though it is difficult to maintain stability thereof under a wide range of the operating voltage. Therefore, in the application of the pulsed latching apparatus with a wide range of the operating voltage, it is important to provide a pulse signal having an adaptive pulse width.

SUMMARY

The disclosure is directed to a pulsed latching apparatus and a method for generating a pulse signal of a pulsed latch, which provides a pulse signal with an adequate pulse width when the pulsed latching apparatus is applied under a wide range of operating voltage.

The disclosure provides a pulsed latching apparatus including a pulsed latch and a pulse signal generator. The pulsed latch has a data input terminal, a pulse signal receiving terminal and a data output terminal. The data input terminal of the pulsed latch receives input data, the pulsed latch latches the input data according to a pulse signal received by the pulse signal receiving terminal, and transmits the latched input data through the data output terminal to serve as output data. The pulse signal generator is coupled to the pulse signal receiving terminal of the pulsed latch. The pulse signal generator duplicates a data transmission delay between the data input terminal and the data output terminal of the pulsed latch to obtain a duplicated delay. The pulse signal generator receives a clock signal, and processes the clock signal according to the duplicated delay to generate the pulse signal.

The disclosure provides a method for generating a pulse signal of a pulsed latch, where the pulsed latch has a data input terminal and a data output terminal. The method for generating the pulse signal includes following steps. A data transmission delay between the data input terminal and the data output terminal of the pulsed latch is duplicated to obtain a duplicated delay. A clock signal is received, and the clock signal is processed according to the duplicated delay to generate the pulse signal.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
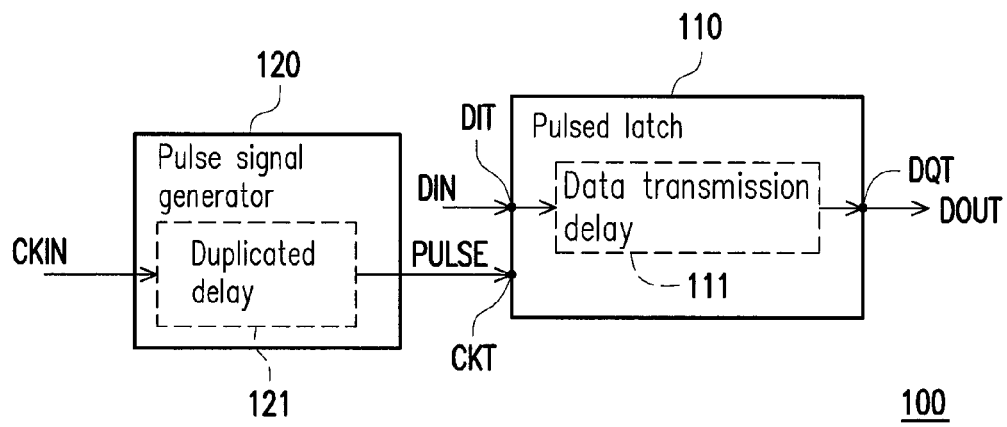
FIG. 1 is a schematic diagram of a pulsed latching apparatus 100 according to an embodiment of the disclosure.

Referring to FIG. 1, FIG. 1 is a schematic diagram of a pulsed latching apparatus 100 according to an embodiment of the disclosure. The pulsed latching apparatus 100 includes a pulsed latch 110 and a pulse signal generator 120. The pulsed latch 110 has a data input terminal DIT, a pulse signal receiving terminal CKT and a data output terminal DQT. The data input terminal DIT of the pulsed latch 110 receives input data DIN. The pulsed latch 110 latches the input data DIN according to a pulse signal PULSE received by the pulse signal receiving terminal CKT. The pulsed latch 110 transmits the latched input data DIN through the data output terminal DQT to serve as an output data DOUT. It should be noticed that there is a data transmission delay 111 between the data input terminal DIT and the data output terminal DQT of the pulsed latch 110. The data transmission delay 111 can be transmission delay caused by circuit devices between the data input terminal DIT and the data output terminal DQT of the pulsed latch 110 and wires between the circuit devices, though the disclosure is not limited thereto.

The pulse signal generator 120 is coupled to the pulse signal receiving terminal CKT of the pulsed latch 110. The pulse signal generator 120 duplicates the data transmission 111 delay between the data input terminal DIT and the data output terminal DQT of the pulsed latch 110 to obtain a duplicated delay 121. The pulse signal generator 120 receives a clock signal CKIN, and processes the clock signal CKIN according to the duplicated delay 121 to generate the pulse signal PULSE.

Here, a pulse width of the pulse signal PULSE generated according to the duplicated delay 121 and the clock signal CKIN is related to the duplicated delay 121. Conceptually, the pulse width of the pulse signal PULSE can be proportional to a magnitude of the duplicated delay 121. Since the duplicated delay 121 is obtained by duplicating the data transmission delay 111, when the data transmission delay 111 is increased, the duplicated delay 121 is accordingly increased, and the pulse width of the pulse signal PULSE is correspondingly increased. Comparatively, when the data transmission delay 111 is decreased, the duplicated delay 121 is accordingly decreased, and the pulse width of the pulse signal PULSE is correspondingly decreased.

In detail, in the pulse signal generator 120, duplication of the data transmission delay 111 can be implemented by configuring a circuit the same to the circuit between the data input terminal DIT and the data output terminal DQT between the pulsed latch 110. In this way, when an operating voltage received by the pulse signal generator 120 and the pulsed latch 110 is changed, regarding the circuit in the pulsed latch 110 that provides the data transmission delay 111 and the circuit in the pulse signal generator 120 that provides the duplicated delay 121, variation amounts of the provided delays are similar (substantially the same). Therefore, according to the pulse signal PULSE generated by the pulse signal generator 120, the pulsed latch 110 can normally perform the data latch operation.

Figure 2:
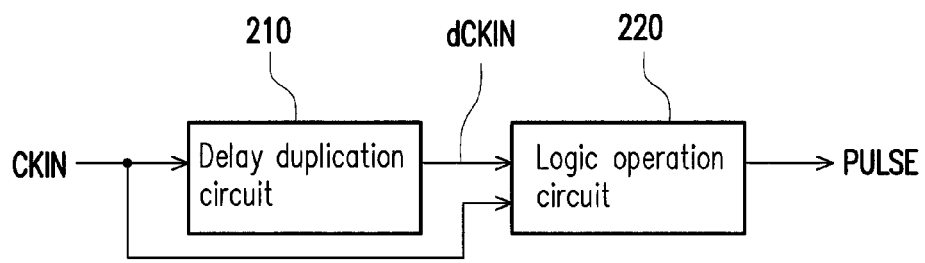
FIG. 2 is a schematic diagram of an implementation of a pulse signal generator 120 according to an embodiment of the disclosure.

Referring to FIG. 2, FIG. 2 is a schematic diagram of an implementation of the pulse signal generator 120 according to an embodiment of the disclosure. The pulse signal generator 120 includes a delay duplication circuit 210 and a logic operation circuit 220. The delay duplication circuit 210 receives the clock signal CKIN. Moreover, the delay duplication circuit 210 provides the duplicated delay, and performs a delay operation on the clock signal CKIN according to the duplicated delay, so as to generate a delayed clock signal dCKIN. The logic operation circuit 220 is coupled to the delay duplication circuit 210, and executes a logic operation according to the clock signal CKIN and the delayed clock signal dCKIN to generate the pulse signal PULSE.

In detail, the logic operation circuit 220 can detect a phase difference between the delayed clock signal dCKIN and the clock signal CKIN, and generates a pulse width of the pulse signal PULSE according to the detected phase difference. In other words, the greater the duplicated delay provided by the delay duplication circuit 210 is, the greater the phase difference between the delayed clock signal dCKIN and the clock signal CKIN is, and the greater the pulse width of the pulse signal PULSE generated by the logic operation circuit 220 is. Comparatively, the smaller the duplicated delay provided by the delay duplication circuit 210 is, the smaller the phase difference between the delayed clock signal dCKIN and the clock signal CKIN is, and the smaller the pulse width of the pulse signal PULSE generated by the logic operation circuit 220 is.

Figure 3A:
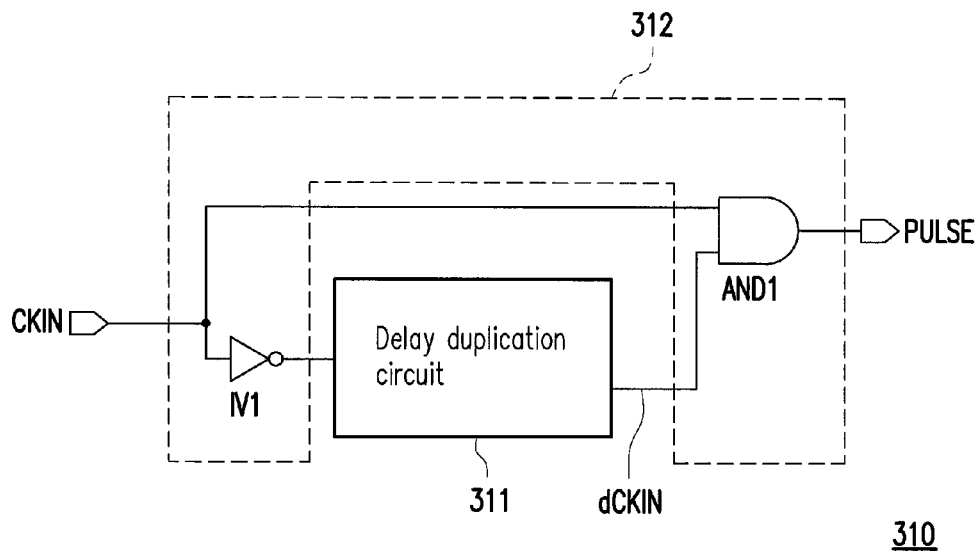
FIG. 3A and FIG. 3B are respectively schematic diagrams of a pulse signal generator according to different embodiments of the disclosure.
Figure 3B:
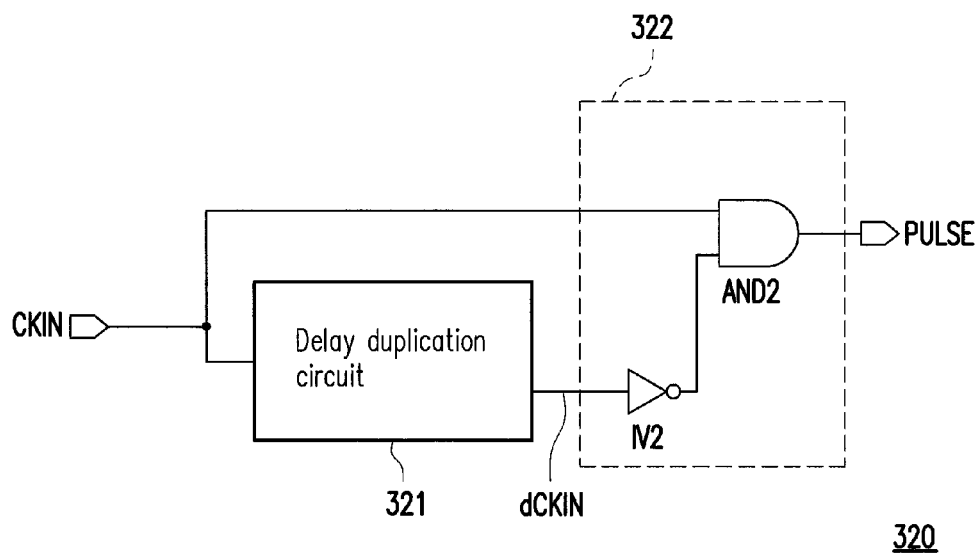

Referring to FIG. 3A and FIG. 3B, FIG. 3A and FIG. 3B are respectively schematic diagrams of a pulse signal generator according to different embodiments of the disclosure. In FIG. 3A, the pulse signal generator 310 includes a delay duplication circuit 311 and a logic operation circuit 312. The logic operation circuit 312 includes an AND gate AND1 and an inverter IV1. The inverter IV1 is connected in series between the delay duplication circuit 311 and the clock signal CKIN, where an input terminal of the inverter IV1 receives the clock signal CKIN, and an output terminal of the inverter IV1 is coupled to the delay duplication circuit 311. Two input terminals of the AND gate AND1 respectively receive the clock signal CKIN and the delayed clock signal dCKIN generated by the delay duplication circuit 311. The AND gate AND1 performs an AND logic operation on the delayed clock signal dCKIN and the clock signal CKIN, and generates the pulse signal PULSE at an output terminal of the AND gate AND1. Certainly, the AND gate AND1 can also be replaced by a NAND gate coupled in series with an inverter. Alternatively, the AND gate AND1 can also be replaced by one or a plurality of logic gates having the same logic operation effect.

In other embodiments of the disclosure, the logic operation circuit 312 can also be composed of more than one and an odd number of inverters and the AND gate AND1, where the inverters can all be coupled in series between the delay duplication circuit 311 and the clock signal CKIN.

Accordingly, the pulse width of the pulse signal PULSE generated by detecting the phase difference between the delayed clock signal dCKIN and the clock signal CKIN may be greater than or equal to the data transmission delay of the pulsed latch 110.

In FIG. 3B, the pulse signal generator 320 includes a delay duplication circuit 321 and a logic operation circuit 322. The logic operation circuit 322 includes an AND gate AND2 and an inverter IV2. An input terminal of the inverter IV2 is coupled to an output terminal of the delay duplication circuit 321 and receives the delayed clock signal dCKIN generated by the delay duplication circuit 321. An output terminal of the inverter IV2 is coupled to an input terminal of the AND gate AND2. Another input terminal of the AND gate AND2 receives the clock signal CKIN. The AND gate AND2 performs an AND logic operation on the delayed clock signal dCKIN and the clock signal CKIN, and generates the pulse signal PULSE at an output terminal of the AND gate AND2. Similarly, the AND gate AND2 can also be replaced by a NAND gate coupled in series with an inverter. Alternatively, the AND gate AND2 can also be replaced by one or more logic gates having the same logic operation effect.

In other embodiments of the disclosure, the logic operation circuit 322 can also be composed of more than one and an odd number of inverters and the AND gate AND2, where the inverters can all be coupled in series between the AND gate AND2 and the delayed clock signal dCKIN.

Figure 4:
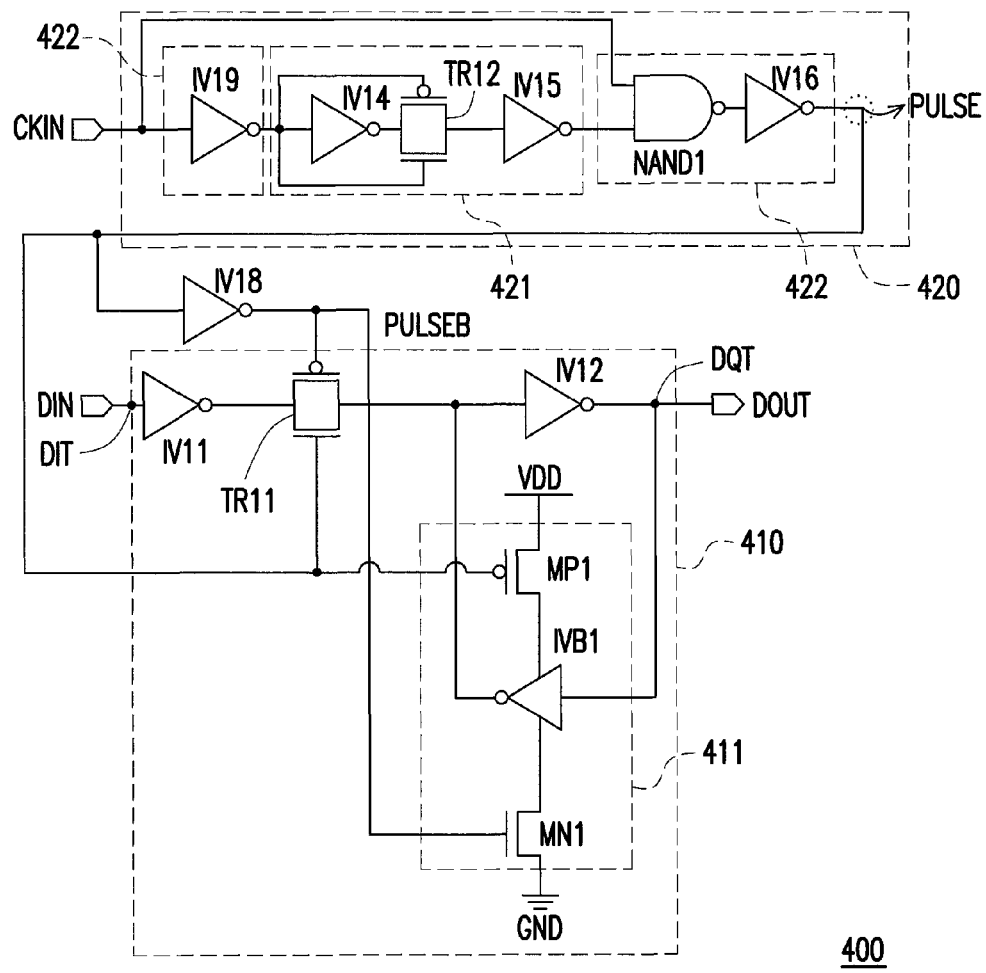
FIG. 4 is a schematic diagram of a pulsed latching apparatus 400 according to another embodiment of the disclosure.

Referring to FIG. 4, FIG. 4 is a schematic diagram of a pulsed latching apparatus 400 according to another embodiment of the disclosure. The pulsed latching apparatus 400 includes a pulsed latch 410 and a pulse signal generator 420. The pulse signal generator 420 generates the pulse signal PULSE and provides the pulse signal PULSE to the pulsed latch 410. The pulsed latch 410 includes inverters IV11 and IV12, a transmission gate TR11 and a feedback circuit 411. An input terminal of the inverter IV11 is coupled to the data input terminal DIT to receive the input data DIN, and an output terminal of the inverter IV11 is coupled to a first terminal of the transmission gate TR11. A second terminal of the transmission gate TR11 is coupled to an input terminal of the inverter IV12, and an output terminal of the inverter IV12 is coupled to the data output terminal DQT to produce the output data DOUT. Control terminals of the transmission gate TR11 receive the pulse signal PULSE and an inverted signal PULSEB of the pulse signal PULSE, and the transmission gate TR11 is turned on or turned off in response to the pulse signal PULSE and the inverted signal PULSEB of the pulse signal PULSE. The inverted signal PULSEB of the pulse signal PULSE is produced by an inverter IV18 that receives the pulse signal PULSE. In the present embodiment, when the pulse signal PULSE has a logic high level (the inverted signal PULSEB has a logic low level), the transmission gate TR11 is turned on. When the pulse signal PULSE has the logic low level (the inverted signal PULSEB has the logic high level), the transmission gate TR11 is turned off.

The feedback circuit 411 is coupled in series between the output terminal of the inverter IV12 and the input terminal (a node coupled between the inverter IV12 and the transmission gate TR11) of the inverter IV12. The feedback circuit 411 includes an inverter IVB1. An input terminal of the inverter IVB1 is coupled to the output terminal of the inverter IV12 for receiving the output data DOUT, and an output terminal of the inverter IVB1 is coupled to the input terminal of the inverter IV12. The inverter IVB1 is respectively coupled to a reference voltage VDD and a reference voltage GND through a transistor MP1 and a transistor MN1, where the reference voltage VDD can be an operating voltage of the pulsed latching apparatus 400, and the reference voltage GND can be a ground voltage.

The transistors MP1 and MN1 are switch devices, and the transistors MP1 and MN1 are respectively controlled by the pulsed signal PULSE and the inverted signal PULSEB of the pulse signal PULSE. The transistors MP1 and MN1 are simultaneously turned on or simultaneously turned off. When the transistors MP1 and MN1 are simultaneously turned on, the output terminal of the inverter IVB1 outputs the inverted output data DOUT to the input terminal of the inverter IV12. Comparatively, when the transistors MP1 and MN1 are simultaneously turned off, the output terminal of the inverter IVB1 has no signal output and is maintained to a high impedance state.

The pulse signal generator 420 includes a delay duplication circuit 421 and a logic operation circuit 422. The delay duplication circuit 421 includes inverters IV14 and IV15 and a transmission gate TR12. The logic operation circuit 422 includes inverters IV19 and IV16 and a NAND gate NAND1. In the delay duplication circuit 421, the inverter IV14, the transmission gate TR12 and the inverter IV15 are coupled sequentially, and control terminals of the transmission gate TR12 are commonly coupled to an input terminal of the inverter IV14 to ensure a turn-on state. It should be noticed that the circuit composed of the inverter IV14, the transmission gate TR12 and the inverter IV15 is similar to the circuit composed of the inverter IV11, the transmission gate TR11 and the inverter IV12 that is coupled between the data input terminal DIT and the data output terminal DQT of the pulsed latch 410. Namely, the duplicated delay generated by the delay duplication circuit 421 is almost the same to the data transmission delay between the data input terminal DIT and the data output terminal DQT of the pulsed latch 410.

Moreover, in the present embodiment, the transmission gates TR11 and TR12 can be composed of transistors having a low threshold voltage, so as to increase a data transmission speed. Moreover, by using the transistors having the low threshold voltage only on the transmission gates TR11 and TR12, while the data transmission speed is increased, increase of excessive leakage current is avoided. Therefore, in the present embodiment, by using the transmission gates TR11 and TR12 composed of the transistors having low threshold voltage, the data transmission speed is effectively increased under a small amount of leakage.

It should be noticed that in the present embodiment, the duplicated delay generated by the delay duplication circuit 421 and the data transmission delay between the data input terminal DIT and the data output terminal DQT of the pulsed latch 410 can be automatically adjusted along with a voltage variation of the operating voltage VDD. Especially, the pulse width of the pulse signal PULSE is automatically adjusted along with the data transmission delay. Namely, even if the pulsed latching apparatus 400 operates at a sub-threshold supply voltage, the pulse signal PULSE can still be adjusted to a suitable pulse width, and the pulsed latching apparatus 400 can be maintained to normally operate. A sub-threshold supply voltage is used for lowering the power consumption.

Figure 5:
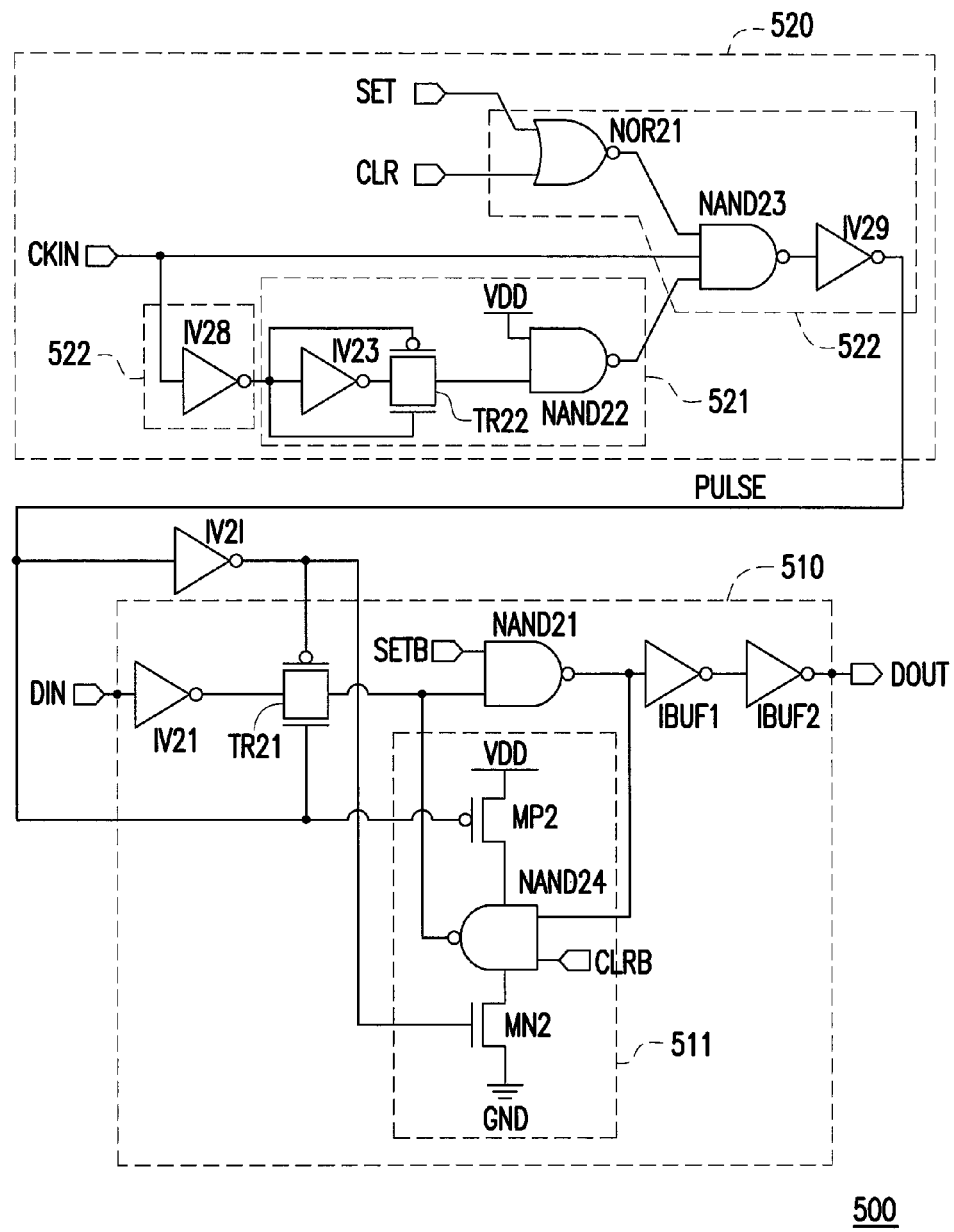
FIG. 5 is a schematic diagram of a pulsed latching apparatus 500 according to still another embodiment of the disclosure.

Referring to FIG. 5, FIG. 5 is a schematic diagram of a pulsed latching apparatus 500 according to still another embodiment of the disclosure. The pulsed latching apparatus 500 includes a pulsed latch 510 and a pulse signal generator 520. The pulsed latch 510 includes inverters IV21, IBUF1 and IBUF2, a transmission gate TR21, NAND gates NAND21, NAND24 and transistors MP2 and MN2. Different to the aforementioned embodiment, the pulsed latch 510 further receives an inverted signal SETB of a setting signal SET and an inverted signal CLRB of a clearing signal CLR. An input terminal of the NAND gate NAND21 is coupled to the transmission gate TR21, and another input terminal of the NAND gate NAND21 receives the inverted signal SETB of the setting signal SET. An input terminal of the NAND gate NAND24 is coupled to an output terminal of the NAND gate NAND21, and another input terminal of the NAND gate NAND24 receives the inverted signal CLRB of the clearing signal CLR. When the setting signal SET and the clearing signal CLR are not enabled, i.e. are all in a logic low level, functions of the NAND gates NAND21 and NAND24 are similar to inverters, and now the pulsed latch 510 has a circuit structure the same to that of the pulsed latch 410 of the aforementioned embodiment.

It should be noticed that compared to the pulsed latch 410, the pulsed latch 510 further includes the inverters IBUF1 and IBUF2 serving as output buffers, where the inverters IBUF1 and IBUF2 are connected in series, and are configured to provide a fan-out capability of the output data DOUT.

Moreover, in case that the setting signal SET has the logic high level, the inverted signal SETB of the setting signal SET has the logic low level, and the output data DOUT is set to the logic high level. When the clearing signal CLR has the logic high level, the inverted signal CLRB of the clearing signal CLR has the logic low level, and the output of the NAND gate NAND24 has the logic high level. In this way, the output data DOUT is cleared to have the logic low level.

The pulse signal generator 520 includes a delay duplication circuit 521 and a logic operation circuit 522. The delay duplication circuit 521 includes an inverter IV23, a transmission gate TR22 and a NAND gate NAND22. The circuit structure of the delay duplication circuit 521 is similar to that of the pulsed latch 510 composed of the inverter IV21, the transmission gate TR21 and the NAND gate NAND21, and a difference there between is that the control terminals of the transmission gate TR21 receive the pulse signal PULSE and the inverted signal PULSEB of the pulse signal PULSE, and the control terminals of the transmission gate TR22 are all coupled to an input terminal of the inverter IV23, where the inverted signal PULSEB is generated by the inverter IV21 according to the pulse signal PULSE.

The inverter IV23 is coupled in series with the transmission gate TR22, and the transmission gate TR22 is coupled to an input terminal of the NAND gate NAND22, and another input terminal of the NAND gate NAND22 receives the reference voltage VDD. It should be noticed that the NAND gate NAND21 is coupled to the two terminals of the feedback circuit 511 of the pulsed latch 510; in order to accurately duplicate the data transmission delay of the pulsed latch 510, the delay duplication circuit 521 constructs the NAND gate NAND22 at a corresponding position.

The logic operation circuit 522 includes an inverter IV28, a NOR gate NOR25, a NAND gate NAND23 and an inverter IV29. In the present embodiment, the NOR gate NOR25 of the logic operation circuit 522 receives the setting signal SET and the clearing signal CLR, and when at least one of the setting signal SET and the clearing signal CLR is enabled (has the logic high level), the NOR gate NOR25 outputs a signal with the logic low level and masks generation of the pulse signal PULSE through the NAND gate NAND23.

Figure 6:
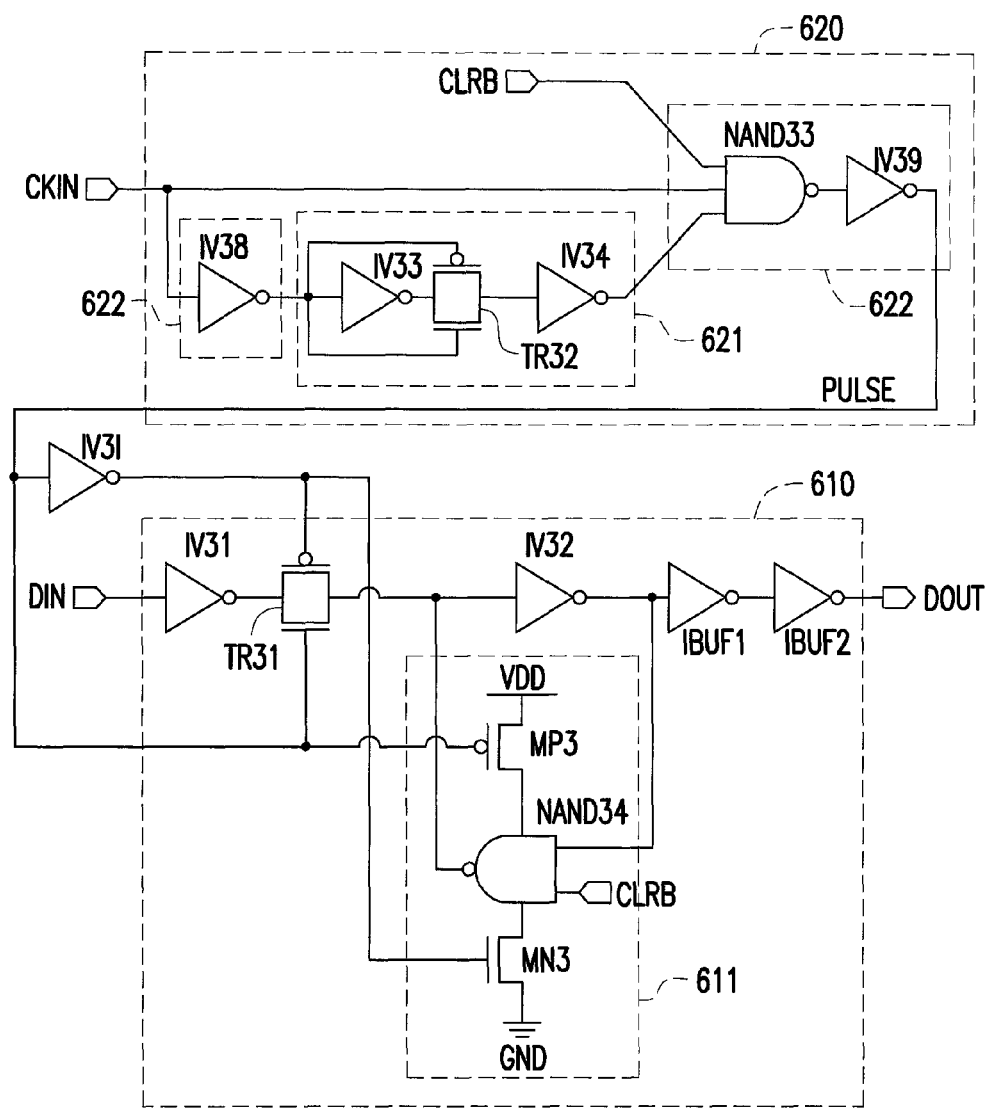
FIG. 6 is a schematic diagram of a pulsed latching apparatus 600 according to yet another embodiment of the disclosure.

Referring to FIG. 6, FIG. 6 is a schematic diagram of a pulsed latching apparatus 600 according to yet another embodiment of the disclosure. The pulsed latching apparatus 600 includes a pulsed latch 610 and a pulse signal generator 620. The pulsed latch 610 includes inverters IV31, IV32, IBUF1 and IBUF2, a transmission gate TR31 and a feedback circuit 611. The feedback circuit 611 includes transistors MP3, MN3 and a NAND gate NAND34. The pulse signal generator 620 includes a delay duplication circuit 621 and a logic operation circuit 622. The delay duplication circuit 621 includes an inverter IV33, a transmission gate TR32 and an inverter IV34. The logic operation circuit 622 includes a NAND gate NAND33 and inverters IV38 and IV39.

The inverter IV31 receives the pulse signal PULSE and generates the inverted signal PULSEB of the pulse signal PULSE.

Different to the embodiment of FIG. 5, in the embodiment of FIG. 6, only the clearing signal CLR is received, and the setting signal SET is not received, so that the NAND gate NAND21 of FIG. 5 is replaced by the inverter IV32 of FIG. 6, and the delay duplication circuit 621 of FIG. 6 accordingly uses the inverter IV34 to duplicate the delay of the inverter IV32, and the inverted signal CLRB of the clearing signal CLR is directly input to the NAND gate NAND33 of FIG. 6 (corresponding NAND gate NAND23 of FIG. 5). Similarly, the pulsed latching apparatus of the disclosure can also receive the setting signal SET only without receiving the clearing signal CLR, for example, the NAND gate NAND24 related to the clearing signal CLR in the embodiment of FIG. 5 is replaced by an inverter, and the inverted signal SETB of the setting signal SET is input to the NAND gate NAND23. Implementation and structure of the embodiment of FIG. 6 are similar to that of the embodiment of FIG. 5, and details thereof are not repeated.

Figure 7:
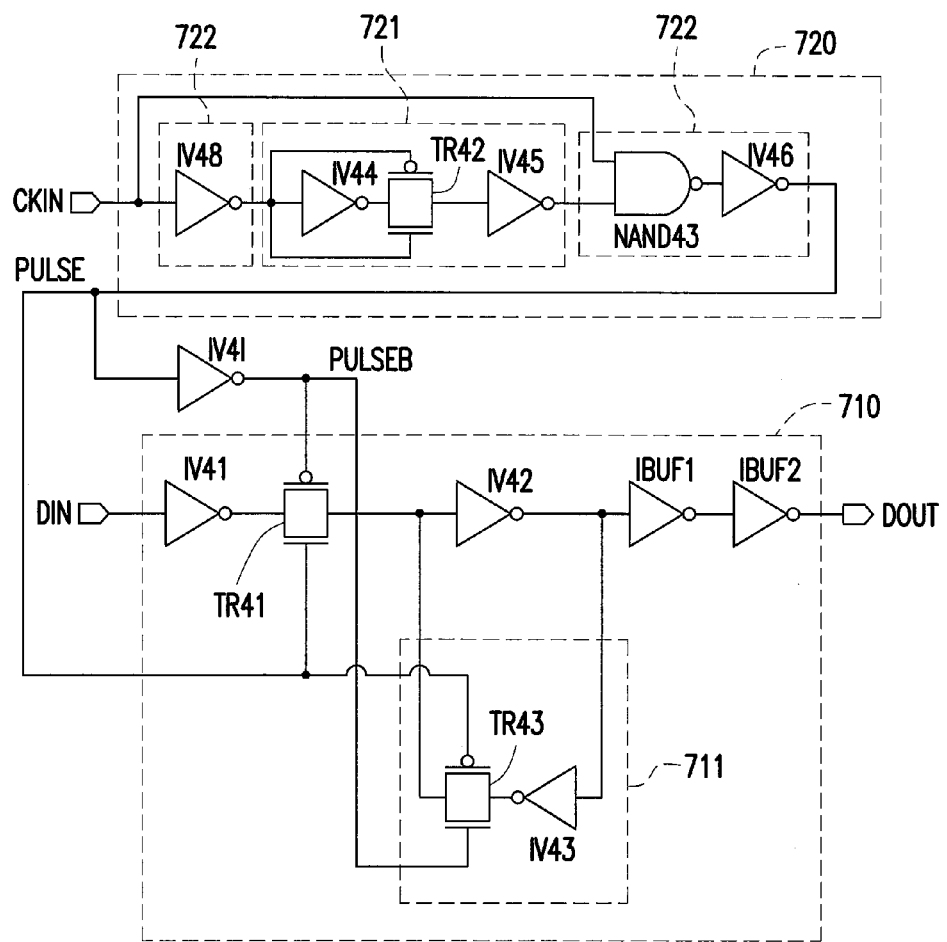
FIG. 7 is a schematic diagram of a pulsed latching apparatus 700 according to still another embodiment of the disclosure.

Referring to FIG. 7, FIG. 7 is a schematic diagram of a pulsed latching apparatus 700 according to still another embodiment of the disclosure. The pulsed latching apparatus 700 includes a pulsed latch 710 and a pulse signal generator 720. The pulsed latch 710 includes inverters IV41, IV42, IBUF1 and IBUF2, a transmission gate TR41 and a feedback circuit 711. The feedback circuit 711 includes an inverter IV43 and a transmission gate TR43. The pulse signal generator 720 includes a delay duplication circuit 721 and a logic operation circuit 722. The delay duplication circuit 721 includes an inverter IV44, a transmission gate TR42 and an inverter IV45. The logic operation circuit 722 includes a NAND gate NAND 43 and inverters IV46 and IV48.

The feedback circuit 711 of the present embodiment is composed of the inverter IV43 and the transmission gate TR43, where an input terminal of the inverter IV43 is coupled to an output terminal of the inverter IV42, and an output terminal of the inverter IV43 is coupled to a first terminal of the transmission gate TR43, and a second terminal of the transmission gate TR43 is coupled to an input terminal of the inverter IV42. A control terminal of the transmission gate TR43 receives the pulse signal PULSE and the inverted signal PULSEB of the pulse signal PULSE. The transmission gate TR43 is turned on or turned off according to the pulse signal PULSE and the inverted signal PULSEB. In the present embodiment, when the pulse signal PULSE has the logic low level, the transmission gate TR43 is turned on. Comparatively, when the pulse signal PULSE has the logic high level, the transmission gate TR43 is turned off. Moreover, when the transmission gate TR43 is turned on, a signal generated at the output terminal of the inverter IV43 can be transmitted to the input terminal of the inverter IV42, and when the transmission gate TR43 is turned off, the signal generated at the output terminal of the inverter IV43 is blocked by the transmission gate TR43 and cannot be transmitted to the input terminal of the inverter IV42.

The inverted signal PULSEB is generated by the inverter IV41 according to the pulse signal PULSE.

Figure 8:
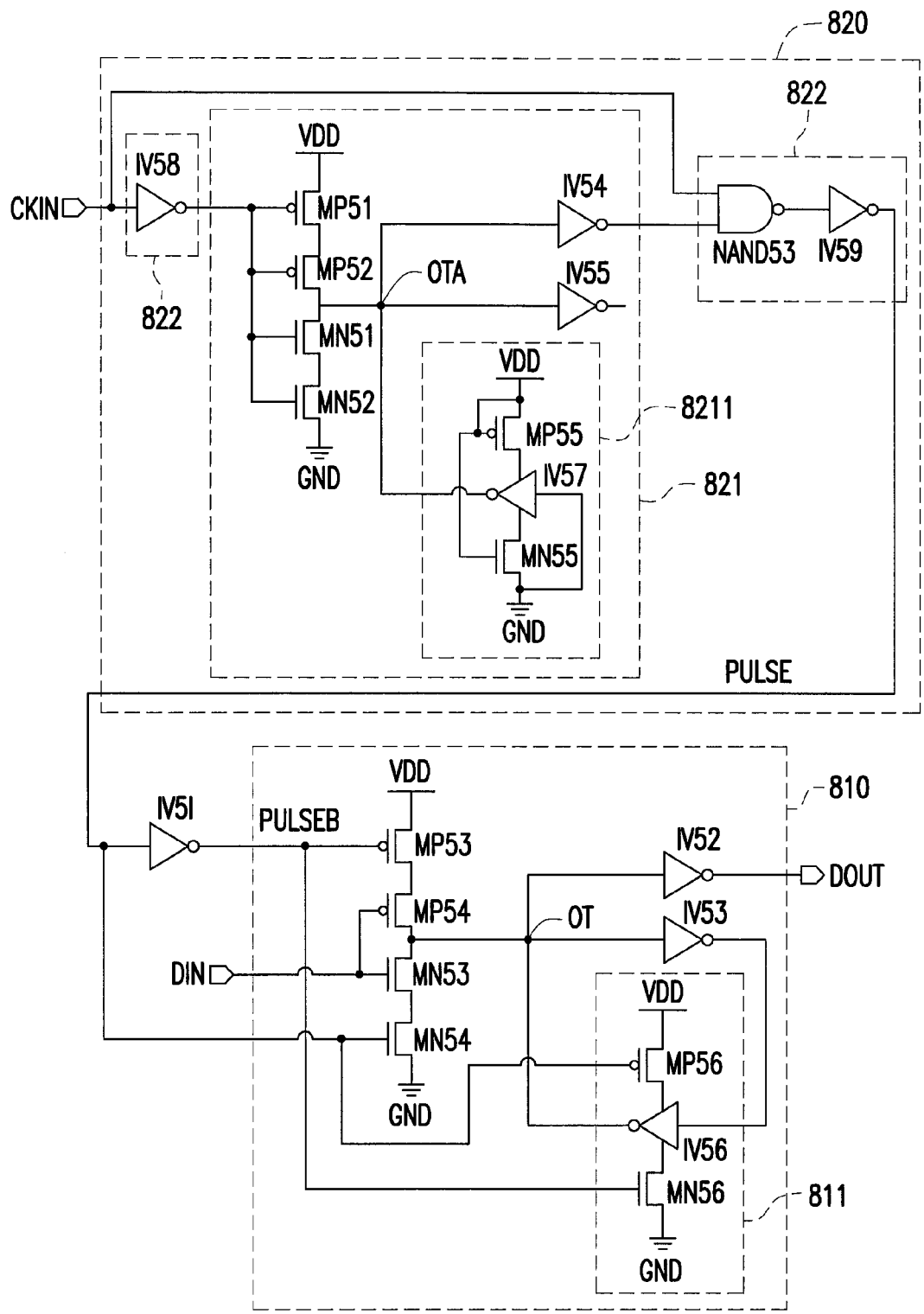
FIG. 8 is a schematic diagram of a pulsed latching apparatus 800 according to still another embodiment of the disclosure.

Referring to FIG. 8, FIG. 8 is a schematic diagram of a pulsed latching apparatus 800 according to still another embodiment of the disclosure. The pulsed latching apparatus 800 includes a pulsed latch 810 and a pulse signal generator 820. The pulsed latch 810 includes an inverter composed of transistors MP53, MP54, MN53 and MN54, inverters IV52 and IV53 and a feedback circuit 811. The transistors MP53 and MP54 are P-type transistors, and the transistors MN53 and MN54 are N-type transistors. A first terminal of the transistor MP53 is coupled to the reference voltage VDD, a second terminal of the transistor MP53 is coupled to a first terminal of the transistor MP54. A control terminal of the transistor MP53 is coupled to the inverter IV5I to receive the inverted signal PULSEB of the pulse signal PULSE. A second terminal of the transistor MP54 is coupled to a first terminal of the transistor MN53, and serves as an output terminal OT of the inverter composed of the transistors MP53, MP54, MN53 and MN54. Control terminals of the transistors MP54 and MN53 commonly receive the input data DIN. A second terminal of the transistor MN53 is coupled to a first terminal of the transistor MN54, and a second terminal of the transistor MN54 is coupled to the reference voltage GND. A control terminal of the transistor Mn54 receives the pulse signal PULSE.

A tri-state inverter formed by the transistors MP53, MP54, MN53 and MN54 can determine whether to transmit the inverted input data DIN to the output terminal OT according to the pulse signal PULSE and the inverted signal PULSEB thereof. In the present embodiment, when the pulse signal PULSE has the logic high level, the tri-state inverter formed by the transistors MP53, MP54, MN53 and MN54 can transmit the inverted input data DIN to the output terminal OT. Comparatively, when the pulse signal PULSE has the logic low level, the tri-state inverter formed by the transistors MP53, MP54, MN53 and MN54 outputs a high impedance, which does not influence the voltage value of the output terminal OT.

Input terminals of the inverters IV52 and IV53 are commonly coupled to the output terminal OT, an output terminal of the inverter IV52 generates the output data DOUT, and an output terminal of the inverter IV53 is coupled to the feedback circuit 811. The feedback circuit 811 is a tri-state inverter, and includes transistors MP56 and MN56 and an inverter IV56. The inverter IV56 is coupled to the reference voltage VDD through the transistor MP56, and the inverter IV56 is coupled to the reference voltage GND through the transistor MN56. A control terminal of the transistor MP56 receives the pulse signal PULSE, and the transistor MN56 receives the inverted signal PULSEB of the pulse signal PULSE.

The pulse signal generator 820 includes a delay duplication circuit 821 and a logic operation circuit 822. The delay duplication circuit 821 includes an inverter composed of transistors MP51, MP52, MN51 and MN52, inverters IV54 and IV55 and a feedback circuit 8211, where the transistors MP51 and MP52 are P-type transistors, and the transistors MN51 and MN52 are N-type transistors. A first terminal of the transistor MP51 is coupled to the reference voltage VDD, and a second terminal of the transistor MP51 is coupled to a first terminal of the transistor MP52. A control terminal of the transistor MP51 is coupled to the inverter IV58. A second terminal of the transistor MP52 is coupled to a first terminal of the transistor MN51, and serves as an output terminal OTA of the inverter composed of the transistors MP51, MP52, MN51 and MN52. Control terminals of the transistors MP51, MP52, MN51 and MN52 are coupled to each other. A second terminal of the transistor MN51 is coupled to a first terminal of the transistor MN52, and a second terminal of the transistor MN52 is coupled to the reference voltage GND.

An input terminal of the inverter IV54 is coupled to the output terminal OTA, and an output terminal of the inverter IV54 is coupled to the logic operation circuit 822. An input terminal of the inverter IV55 is coupled to the output terminal OTA, and an output terminal of the inverter IV55 is floating. Moreover, the feedback circuit 8211 includes transistors MP55, MN55 and an inverter IV57. An input terminal of the inverter IV57 is coupled to the reference voltage GND, and an output terminal of the inverter IV57 is coupled to the output terminal OTA. The inverter IV57 is coupled to the reference voltage VDD through the transistor MP55, and is coupled to the reference voltage GND through the transistor MN55. Moreover, a control terminal and a first terminal of the transistor MP55 are commonly coupled to the reference voltage VDD, and a control terminal of the transistor MN55 is coupled to the control terminal of the transistor MP55 for receiving the reference voltage VDD. Namely, the transistor MP55 is maintained to the turn-off state, and the transistor MN55 is maintained to the turn-on state. Since the input terminal of the inverter IV57 is coupled to the reference voltage GND, the output terminal of the inverter IV57 is maintained to a high impedance state.

The feedback circuit 8211 in the delay duplication circuit 821 ensures that the delay duplication circuit 821 completely duplicates the data transmission delay of the pulsed latch 810, which includes leakage in data transmission and influence of parasitic capacitance on the transmission delay, so as to obtain the accurate duplicated delay.

The logic operation circuit 822 includes a NAND gate NAND53 and inverters IV58 and IV59. The operation method of the logic operation circuit 822 is the same to that of the logic operation circuits of the aforementioned embodiments, which is not repeated.

Figure 9:
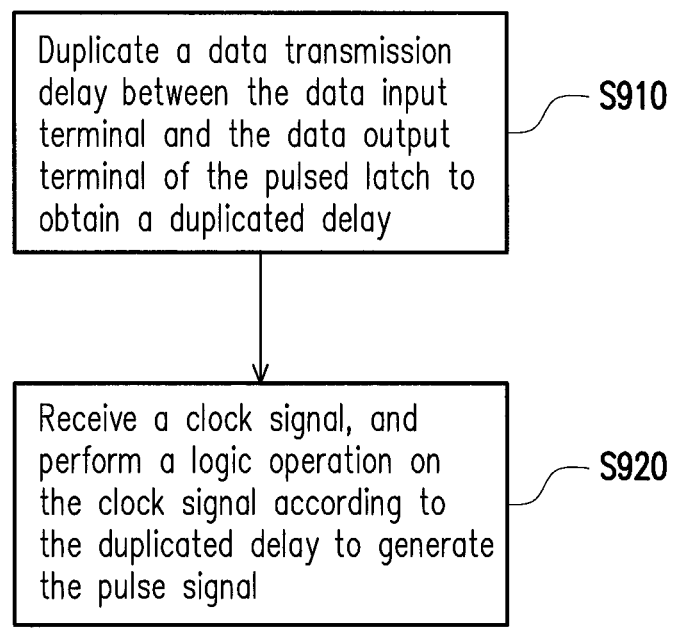
FIG. 9 is a flowchart illustrating a method for generating a pulse signal of a pulsed latch according to an embodiment of the disclosure.

Referring to FIG. 9, FIG. 9 is a flowchart illustrating a method for generating a pulse signal of a pulsed latch according to an embodiment of the disclosure. Where, the pulsed latch has a data input terminal and a data output terminal. The method for generating the pulse signal includes following steps. In step S910, a data transmission delay between the data input terminal and the data output terminal of the pulsed latch is duplicated to obtain a duplicated delay. Then, in step S920, a clock signal is received, and a logic operation is performed on the clock signal according to the duplicated delay to generate the pulse signal.

Implementation details of the above method for generating the pulse signal have been described in detail in the aforementioned embodiments and related implementation of the pulsed latching apparatus, and details thereof are not repeated.

In summary, the pulse signal generator is used to duplicate the data transmission delay between the data input terminal and the data output terminal of the pulsed latch to obtain the duplicated delay, and the clock signal is processed according to the duplicated delay to generate the pulse signal. In this way, the pulse width of the pulse signal can be adaptively adjusted according to the magnitude of the operating voltage received by the pulsed latching apparatus. Therefore, the pulsed latching apparatus of the disclosure can be applied to a wide range of operating voltages, and is a high flexibility to tune the circuit speed and power consumption. At a high operating voltage, the pulsed latching apparatus of the disclosure can have a high speed; at a low operating voltage, the pulsed latching apparatus of the disclosure can effectively save the power consumption.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A pulsed latching apparatus, comprising:
   a pulsed latch, having a data input terminal, a pulse signal receiving terminal and a data output terminal, wherein the data input terminal receives a input data, the pulsed latch latches the input data according to a pulse signal received by the pulse signal receiving terminal, and the pulsed latch transmits the latched input data through the data output terminal to be an output data; and
   a pulse signal generator, coupled to the pulse signal receiving terminal of the pulsed latch, and the pulse signal generator receiving a clock signal and processing the clock signal according to a duplicated delay to generate the pulse signal,
   wherein the duplicated delay equals to a data transmission delay between the data input terminal and the data output terminal.

2. The pulsed latching apparatus as claimed in claim 1, wherein the pulse signal generator comprises:
   a delay duplication circuit, receiving the clock signal and providing the duplicated delay, and delaying the clock signal according to the duplicated delay to generate a delayed clock signal; and
   a logic operation circuit, coupled to the delay duplication circuit, and generating the pulse signal according to the delayed clock signal and the clock signal.

3. The pulsed latching apparatus as claimed in claim 2, wherein the pulsed latch comprises:
   a first inverter, having an input terminal and an output terminal, wherein the input terminal of the first inverter receives the input data;
   a first transmission gate, having a first terminal, a second terminal and a control terminal, wherein the first terminal of the first transmission gate is coupled to the output terminal of the first inverter, and the control terminal of the first transmission gate receives the pulse signal;

a second inverter, having an input terminal and an output terminal, wherein the input terminal of the second inverter is coupled to the second terminal of the first transmission gate, and the output terminal of the second inverter is coupled to the data output terminal; and a feedback circuit, coupled in series between the data output terminal and the second terminal of the first transmission gate, and receiving the pulse signal and determining whether to transmit the output data to the second terminal of the first transmission gate according to the pulse signal.

4. The pulsed latching apparatus as claimed in claim 3, wherein the delay duplication circuit comprises:

a third inverter, having an input terminal and an output terminal, wherein the input terminal of the third inverter receives the clock signal;

a second transmission gate, having a first terminal, a second terminal and a control terminal, wherein the first terminal of the second transmission gate is coupled to the output terminal of the third inverter, and the control terminal of the second transmission gate receives the clock signal; and a fourth inverter, having an input terminal and an output terminal, wherein the input terminal of the fourth inverter is coupled to the second terminal of the second transmission gate, and the output terminal of the fourth inverter is coupled to the logic operation circuit.

5. The pulsed latching apparatus as claimed in claim 4, wherein the first transmission gate and the second transmission gate are composed of transistors with a low threshold voltage.

6. The pulsed latching apparatus as claimed in claim 3, wherein the feedback circuit comprises:

a first tri-state inverter, having an input terminal, an output terminal and a control terminal, wherein the input terminal of the first tri-state inverter receives the output data, the output terminal of the first tri-state inverter is coupled to the input terminal of the second inverter, the control terminal of the first tri-state inverter receives the pulse signal, and the first tri-state inverter determines whether to output the inverted output data to the input terminal of the second inverter according to the pulse signal.

7. The pulsed latching apparatus as claimed in claim 3, wherein the feedback circuit comprises:

a third inverter, having an input terminal and an output terminal, wherein the input terminal of the third inverter receives the output data; and a second transmission gate, having a first terminal, a second terminal and a control terminal, wherein the first terminal of the second transmission gate is coupled to the output terminal of the third inverter, the second terminal of the second transmission gate is coupled to the input terminal of the second inverter, and the control terminal of the second transmission gate receives the pulse signal.

8. The pulsed latching apparatus as claimed in claim 2, wherein the logic operation circuit comprises:

N inverters, each of the N inverters having an input terminal and an output terminal, wherein the inverters are coupled in series to each other, and the input terminal of a first one of the inverters receives the delayed clock signal, wherein N is an odd number; and an AND gate, having a first input terminal receiving the clock signal, a second input terminal coupled to the output terminal of a last one of the inverter, and an output terminal generating the pulse signal.

9. The pulsed latching apparatus as claimed in claim 2, wherein the logic operation circuit comprises:

N inverters, each of the N inverters having an input terminal and an output terminal, and coupled in series between the delay duplication circuit and the clock signal, wherein the input terminal of a first one of the inverters receives the clock signal, and the output terminal of a last one of the inverters is coupled to the delay duplication circuit, wherein N is an odd number; and an AND gate, having a first input terminal receiving the clock signal, a second input terminal receiving the delayed clock signal, and an output terminal generating the pulse signal.

10. The pulsed latching apparatus as claimed in claim 2, wherein the pulsed latch comprises:

a tri-state inverter, having an input terminal, an output terminal and a control terminal, wherein the control terminal of the tri-state inverter receives the pulse signal, the input terminal of the tri-state inverter receives the input data, and the tri-state inverter determines whether to transmit the inverted input data to the output terminal of the tri-state inverter according to the pulse signal;

a first inverter, having an input terminal and an output terminal, wherein the input terminal of the first inverter is coupled to the output terminal of the tri-state inverter, and the output terminal of the first inverter generates the output data;

a second inverter, having an input terminal and an output terminal, wherein the input terminal of the second inverter is coupled to the output terminal of the tri-state inverter; and a first feedback circuit, coupled in series between the output terminal of the tri-state inverter and the output terminal of the second inverter, and receiving the pulse signal and determining whether to transmit an inverted signal of a signal on the output terminal of the second inverter to the output terminal of the tri-state inverter according to the pulse signal.

11. The pulsed latching apparatus as claimed in claim 10, wherein the tri-state inverter comprises:

a first transistor, having a first terminal, a second terminal and a control terminal, wherein the first terminal of the first transistor is coupled to a first reference voltage, and the control terminal of the first transistor receives an inverted signal of the pulse signal;

a second transistor, having a first terminal, a second terminal and a control terminal, wherein the first terminal of the second transistor is coupled to the second terminal of the first transistor, the control terminal of the second transistor receives the input terminal, and the second terminal of the second transistor serves as the output terminal of the tri-state inverter;

a third transistor, having a first terminal, a second terminal and a control terminal, wherein the first terminal of the third transistor is coupled to the second terminal of the second transistor, and the control terminal of the third transistor receives the input data; and a fourth transistor, having a first terminal, a second terminal and a control terminal, wherein the first terminal of the fourth transistor is coupled to the second terminal of the third transistor, the control terminal of the fourth transistor receives the pulse signal, and the second terminal of the fourth transistor is coupled to a second reference voltage, wherein types of the first and the second transistors are the same, types of the third and the fourth transistors are the same, and the types of the first and the third transistors are complementary.

12. The pulsed latching apparatus as claimed in claim 10, wherein the first feedback circuit comprises:
a third inverter, having an input terminal, an output terminal and a control terminal, wherein the input terminal of the third inverter is coupled to the output terminal of the second inverter, the output terminal of the third inverter is coupled to the output terminal of the tri-state inverter, the control terminal of the tri-state inverter receives the pulse signal, and the tri-state inverter determines whether to output an inverted signal of a signal on the output terminal of the second inverter to the output terminal of the tri-state inverter according to the pulse signal.

13. The pulsed latching apparatus as claimed in claim 10, wherein the delay duplication circuit comprises:
a third inverter, having an input terminal, an output terminal and a control terminal, wherein the control terminal and the input terminal of the third inverter commonly receive the clock signal, and the third inverter transmits the inverted clock signal to the output terminal of the third inverter;
a fourth inverter, having an input terminal and an output terminal, wherein the input terminal of the fourth inverter is coupled to the output terminal of the third inverter, and the output terminal of the fourth inverter generates the delayed clock signal;
a fifth inverter, having an input terminal and an output terminal, wherein the input terminal of the fifth inverter is coupled to the output terminal of the third inverter, and the output terminal of the fifth inverter is floating; and
a second feedback circuit, coupled to the output terminal of the third inverter.

14. The pulsed latching apparatus as claimed in claim 13, wherein the third inverter comprises:
a first transistor, having a first terminal, a second terminal and a control terminal, wherein the first terminal of the first transistor is coupled to a first reference voltage, and the control terminal of the first transistor receives an inverted signal of the clock signal;
a second transistor, having a first terminal, a second terminal and a control terminal, wherein the first terminal of the second transistor is coupled to the second terminal of the first transistor, the control terminal of the second transistor is coupled to the control terminal of the first transistor, and the second terminal of the second transistor serves as the output terminal of the third inverter;
a third transistor, having a first terminal, a second terminal and a control terminal, wherein the first terminal of the third transistor is coupled to the second terminal of the second transistor, and the control terminal of the third transistor is coupled to the control terminal of the first transistor; and a fourth transistor, having a first terminal, a second terminal and a control terminal, wherein the first terminal of the fourth transistor is coupled to the second terminal of the third transistor, the control terminal of the fourth transistor is coupled to the control terminal of the first transistor, and the second terminal of the fourth transistor is coupled to a second reference voltage,
wherein types of the first and the second transistors are the same, types of the third and the fourth transistors are the same, and the types of the first and the third transistors are complementary.

15. The pulsed latching apparatus as claimed in claim 13, wherein the second feedback circuit comprises:
a sixth inverter, having an input terminal, an output terminal and a control terminal, wherein the input terminal of the sixth inverter is coupled to a second reference voltage, the output terminal of the sixth inverter is coupled to the output terminal of the fourth inverter, and the control terminal of the sixth inverter is coupled to a first reference voltage, wherein the output terminal of the sixth inverter presents a high impedance state.

16. The pulsed latching apparatus as claimed in claim 1, wherein the pulse signal generator further receives a clearing signal and/or a setting signal, and sets a logic level of the pulse signal according to the clearing signal and/or the setting signal, and the pulsed latch further receives the clearing signal and/or the setting signal, and clears the output data according to the clearing signal or sets the output data according to the setting signal.

17. A method for generating a pulse signal of a pulsed latch, wherein the pulsed latch has a data input terminal and a data output terminal, comprising:
receiving an input data by the data input terminal, and latching the input data to obtain a latched input data by the pulsed latch according to a pulse signal received by the pulse signal receiving terminal;
transmitting the latched input data through the data output terminal to be an output data;
receiving a clock signal, and processing the clock signal according to a duplicated delay to generate the pulse signal,
wherein the duplicated delay equals to a data transmission delay between the data input terminal and the data output terminal.

18. The method for generating the pulse signal as claimed in claim 17, wherein the step of processing the clock signal according to the duplicated delay to generate the pulse signal comprises:
delaying the clock signal according to the duplicated delay to generate a delayed clock signal; and
performing a logic operation on the delayed clock signal and the clock signal to generate the pulse signal.

* * * * *